US005519240A

United States Patent [19]

Suzuki

[11] Patent Number: 5,519,240

[45] Date of Patent: May 21, 1996

[54] MICROSHUTTER HORIZONTALLY MOVABLE BY ELECTROSTATIC REPULSION

[75] Inventor: Kenichiro Suzuki, Tokyo, Japan

[73] Assignee: NEC Corporation, Tokyo, Japan

[21] Appl. No.: 202,498

[22] Filed: Feb. 28, 1994

[30] Foreign Application Priority Data

Feb. 26, 1993 [JP] Japan .................................... 5-037144

[51] Int. Cl.[6] ............................ H01L 29/10; H01L 29/78

[52] U.S. Cl. .......................... 257/315; 257/322; 257/435; 310/309

[58] Field of Search .................................... 257/314, 315, 257/322, 434, 435, 290; 310/309

[56] References Cited

U.S. PATENT DOCUMENTS 5,270,562 12/1993 Waidart .................................. 257/435

5,396,066 3/1995 Ikeda et al. ............................ 310/309

5,428,259 6/1995 Suzaki .................................. 310/309

FOREIGN PATENT DOCUMENTS 61-100961 5/1986 Japan .................................... 257/435

*Primary Examiner*—Donald L. Monin, Jr.

*Attorney, Agent, or Firm*—Young & Thompson

[57] ABSTRACT

An electrostatically driven microshutter comprises a substrate having a principal surface, a floating gate on the principal surface of the substrate, and a shutter mechanism formed of conductive material and electrically connected to the floating gate, the shutter mechanism comprising a shutter and resilient support means for supporting the shutter from the principal surface so that the shutter is movable in a direction parallel to the principal surface by electrostatic repulsion between the shutter and the floating gate. A transistor is provided for injecting electrons into the floating gate in response to a first voltage signal and decreasing the electrons injected in the shutter mechanism in response to a second voltage signal.

26 Claims, 7 Drawing Sheets

FIG. 10
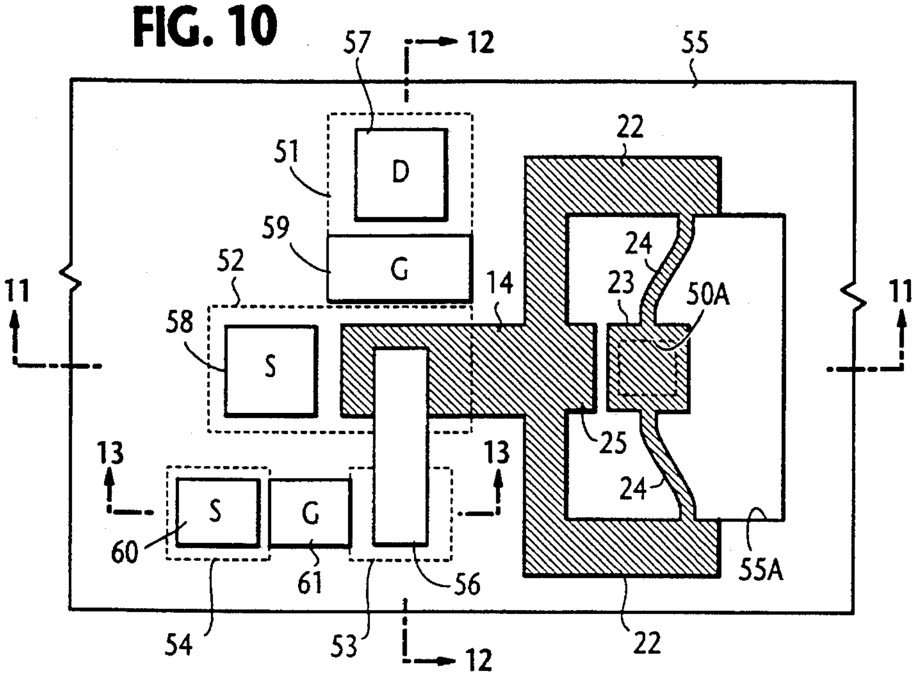
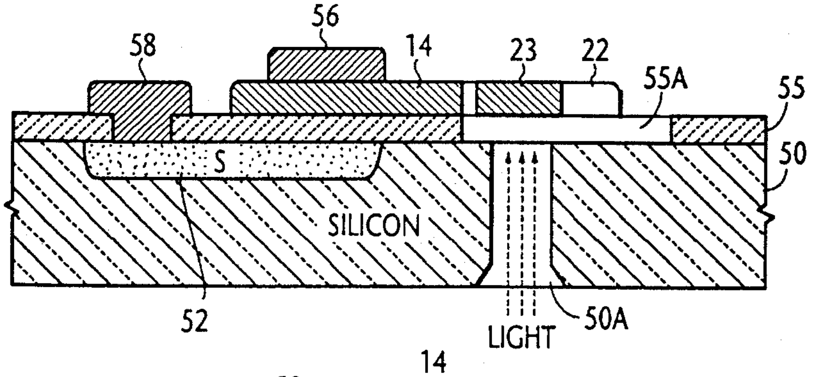
FIG. 11
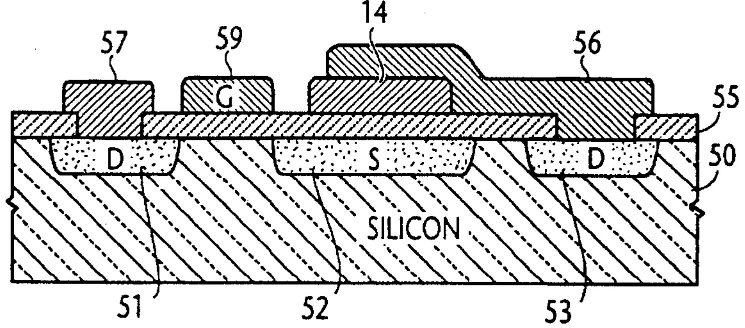
FIG. 12
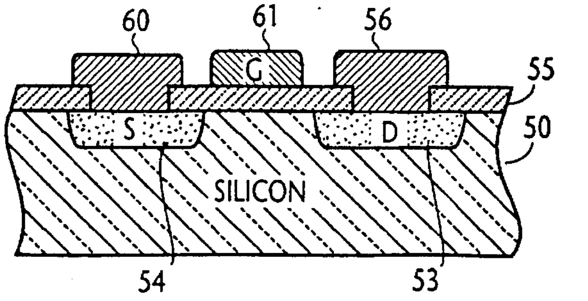
FIG. 13

MICROSHUTTER HORIZONTALLY MOVABLE BY ELECTROSTATIC REPULSION

BACKGROUND OF THE INVENTION

Field of the Invention

The present invention relates generally to micromechanical structures, and more specifically to an electrostatically driven microshutter.

Description of the Related Art

An electrostatically driven microshutter array is disclosed in a patent application PCT/US85/01585 (published under WO86/01626). The disclosed array comprises a conductive pattern of rows formed on a first transparent plate and a conductive pattern of columns on a second transparent plate to form a plurality of intersecting electrodes. A matrix array of PET (polyethylene terephthalate) films are provided on the second transparent substrate to serve as shutters. Each shutter is swingable along one edge from a horizontal position to a vertical position in response to a coincidence of X and Y signals applied to the electrodes. When a given shutter is selected, an electrostatic field is generated between a pair of intersecting electrodes, and it tends to align with the direction of the field and swings open to the vertical position, allowing light to pass therethrough.

However, because of the swinging movement of the shutter structure, a substantial amount of air must be displaced when the shutter is opened or closed, resulting in a slow operating speed. Additionally, when the applied voltage is terminated, the shutter is returned to the horizontal position by the self-returning force of the PET film. Since the self-returning force of the PET film is produced as a result of the twist along the axis about which it swings, it is difficult in practice to manufacture PET films that always return precisely to the same closed position. A further disadvantage of the prior art microshutter mechanism is that voltages must be applied continuously to keep the shutter open. If an attempt were to be made to latch the shutters in open position, another set of wirings would be necessary. Even so, a failure in such wirings would cause the latch mechanism to fail.

SUMMARY OF THE INVENTION

It is therefore an object of the present invention to provide an electrostatically driven microshutter that can be practically implemented.

It is another an object of the present invention to provide an electrostatically driven microshutter of latching type.

It is a further object of the present invention to provide an electrostatically driven microshutter capable of operating at high speed.

According to the present invention, there is provided an electrostatically driven microshutter comprising a substrate having a principal surface, a floating gate on the principal surface of the substrate, 1 and a shutter mechanism formed of conductive material and electrically connected to the floating gate, the shutter mechanism comprising a shutter and resilient support means for supporting the shutter from the principal surface so that the shutter is movable in a direction parallel to the principal surface by electrostatic repulsion between the shutter and the floating gate. Control means, or transistor is provided for injecting electrons into the floating gate in response to a first voltage signal and decreasing the electrons injected in the shutter mechanism in response to a second voltage signal.

According to a first aspect of the present invention, the control means comprises a transistor having source and drain regions for establishing a conduction channel therebetween, and a gate region for controlling a current through the conduction channel in response to the first voltage signal, wherein the floating gate is located between the conduction channel and the gate region so that the electrons are injected from the conduction channel into the floating gate in response to the first voltage signal.

According to a second aspect of the present invention, the control means comprises a first transistor having source and drain for establishing a conduction channel therebetween, and a gate for controlling a current in the conduction channel, the source region being located in proximity to the floating gate, the gate of the first transistor being responsive to the first voltage signal for attracting electrons from the floating gate to the source of the first transistor so that the floating gate acquires a negative charge on a first surface thereof proximal to the source region and acquires a positive charge on a second surface thereof distal to the source region. A second transistor is connected to the floating gate for neutralizing the positive charge, so that the attracted electrons are trapped in the floating gate and said shutter mechanism.

BRIEF DESCRIPTION OF THE DRAWINGS

The present invention will be described in further detail with reference to the accompanying drawings, in which:

FIG. 10 is a plan view of a microshutter cell according to a second preferred embodiment of the present invention;

FIGS. 11, 12 and 13 are cross-sectional views taken along the lines 11—11, 12—12 and 13—13 of FIG. 10, respectively;

DETAILED DESCRIPTION

Figure 1:
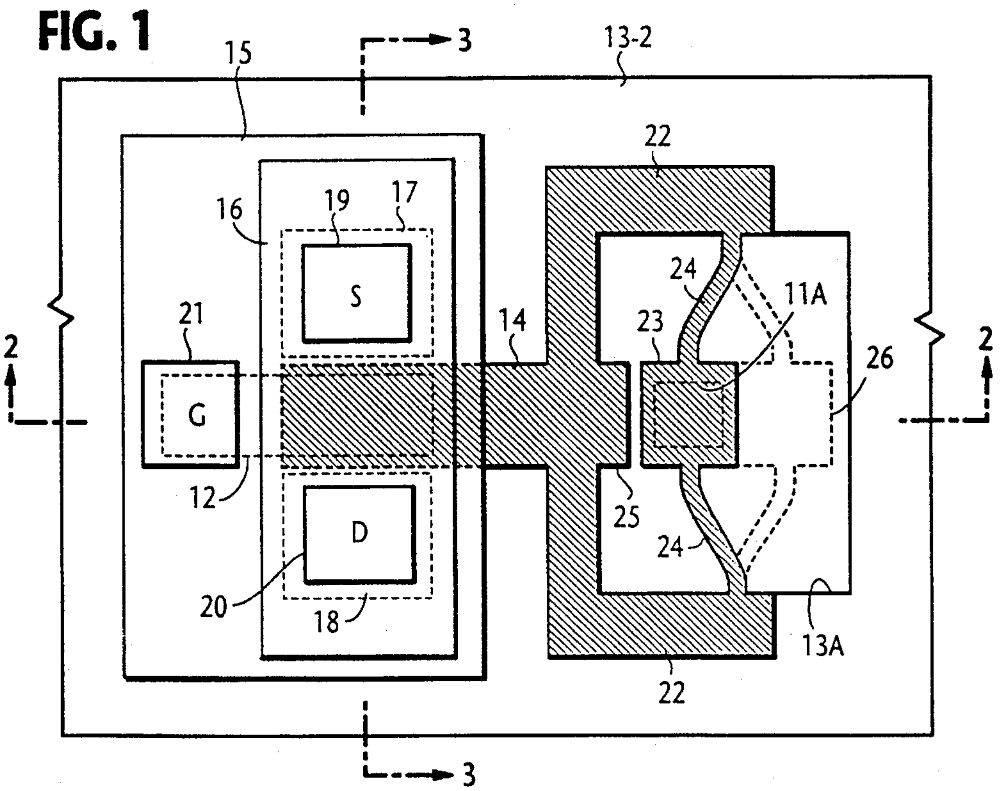
FIG. 1 is a plan view of a microshutter cell according to a first preferred embodiment of the present invention.
Figure 2:
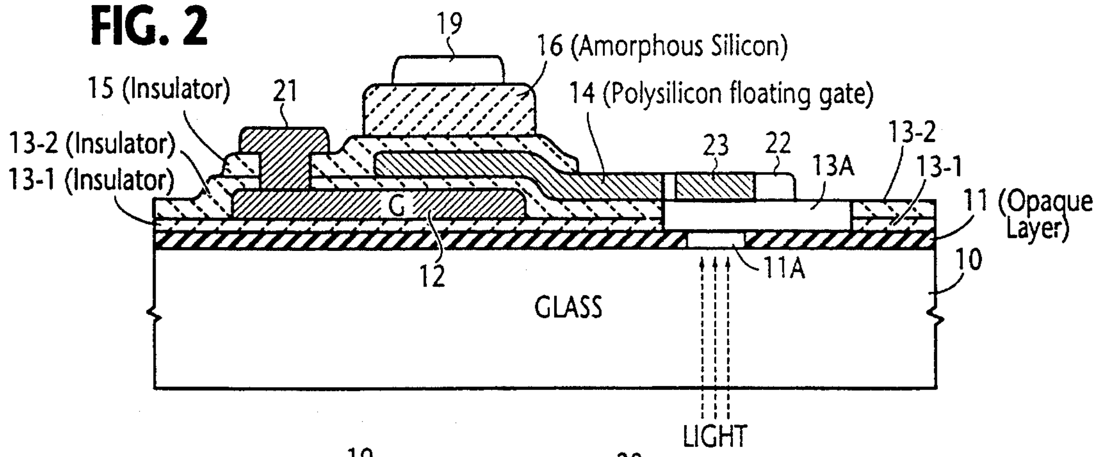
FIGS. 2 and 3 are cross-sectional views taken along the lines 2—2 and 3—3 of FIG. 1, respectively.
Figure 3:
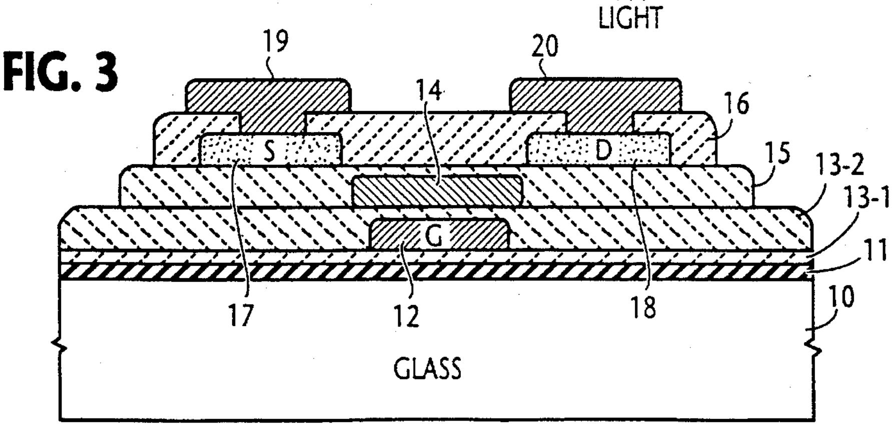

Referring now to FIGS. 1 to 3, there is shown a microshutter cell according to a first embodiment of the present invention. The microshutter cell comprises generally a transistor and a mechanical moving part both mounted on a common substrate 10 of light transmissive material such as glass. On the glass substrate 10 is an opaque layer 11 formed with a window 11A. Light is made to be incident from underside of glass substrate 10 and allowed to pass upwards through window 11A. A layer 13-1 of insulative material such as silicon dioxide is laid on the opaque layer 11 and a metallized contact 12 is formed on the layer 13-1 to serve as the gate of the transistor. A second insulative layer 13-2 of silicon dioxide is formed on the first insulative layer 13-1 so that the gate 12 is overlaid with the insulative layer 13-2. Polysilicon is deposited on the insulative layer 13-2. By using a photo-etching process, the polysilicon is etched to produce a floating gate 14 immediately above the gate 12 and an electrostatic shutter mechanism which is formed by a pair of parallel conductive regions 22, a shutter 23 and a pair of arms 24 which not only act as a support but as a returning spring for the shutter 23. The leftside edge of shutter 23 is facing opposite to a projecting portion 25 of the floating gate 14. The etching process is continued so that part of the underlying insulative layers 13-1 and 13-2 are etched away to expose part of the underlying opaque layer 11, while eroding sideways below the shutter 23 and its supporting arms 24 to create an etched well 13A as seen in FIG. 2. In this way, the shutter 23 is rendered horizontally movable from a left, shutter closing position over the window 11A to a right, shutter opening position where light from the window 11A is allowed to pass.

An insulative layer 15 is then deposited on the leftside of the insulative layer 13-2 so that the floating gate 14 is sandwiched between both insulative layers 13-2 and 15. An amorphous silicon layer 16 is formed on the insulative layer 15 in which source and drain regions 17 and 18 are subsequently produced by using a diffusing technique, forming a conduction channel between source and drain regions 17, 18 immediately above the polysilicon floating gate 14. The amorphous layer 16 is then etched in positions over the source and drain regions 17 and 18 and metallized contacts are formed to serve as source and drain electrodes 19 and 20 of the transistor. Likewise, the insulative layers 15 and 13-2 are etched to the gate region 12 and a metallized contact is formed thereon serve a gate electrode 21 of the transistor. In this way, a field effect transistor driving circuit is fabricated and the floating gate 14 is disposed between the gate region 12 and the conduction channel of the transistor.

Figure 4A:
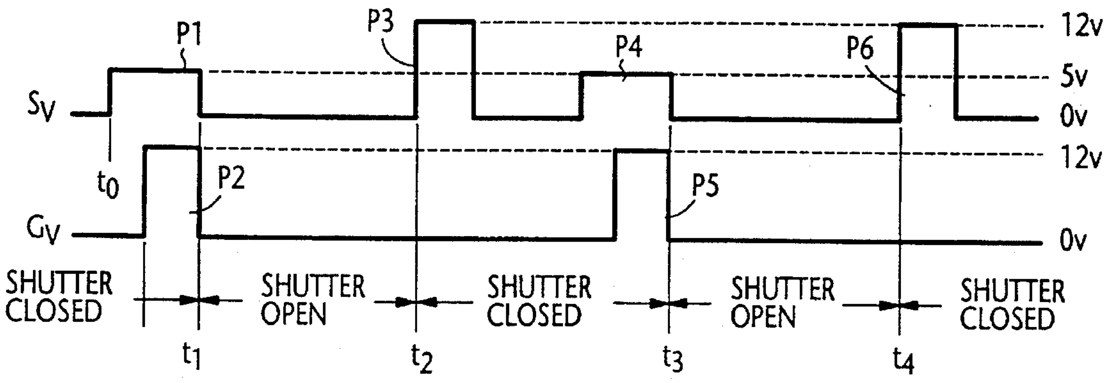
FIG. 4A is a time sequence of pulses used to drive the microshutter cells of FIG. 1.

In operation, the drain electrode 20 is connected to ground, and source and gate control voltages $S_v$ and $G_v$ are applied to the source and gate electrodes 19 and 21, respectively. As illustrated in FIG. 4A, with the shutter 23 is initially in the closed position, a pulse P1 of typically 5 volts is applied to the source electrode 19 during the interval $t_0$ to $t_1$ and a pulse P2 of 12 volts is applied to the gate electrode 21 during the interval $t_1$ to $t_2$. The application of the 12-volt gate pulse P2 causes hot electrons in the source-drain channel region to be migrated through the insulative layer 13 and injected into the floating gate 14. The termination of the gate pulse P2 at time $t_2$ causes the injected electrons to spread out from the floating gate 14 into the electrostatic shutter of the cell connected to it. Thus, the injected electrons are trapped in the shutter mechanism and electrostatic repulsion occurs between the edges of shutter 23 and portion 25, causing shutter 23 to be moved against the spring force of arms 24 to a position as indicated by dotted lines 26 and latched in this position until the trapped electrons are discharged. Light is thus allowed to pass through the window 11A as long as the shutter is latched in the shutter opening position. When closing the window 11A, a 12-volt pulse P3 is applied to the source electrode 19 at time $t_2$. The application of pulse P3 causes the trapped electrons to be discharged from the floating gate 14 through the insulative layer 15 to the source region 17. The shutter 23 is returned to the shutter closing position by the spring action of arms 24 in response to the leading edge of pulse P3 at time $t_2$. The open and close movements of the shutter are repeated in the same manner by application of pulses P4 and P5 for injecting electrons at time $t_3$ and application of pulse P6 for discharging the injected electrons at time $t_4$.

Figure 4B:
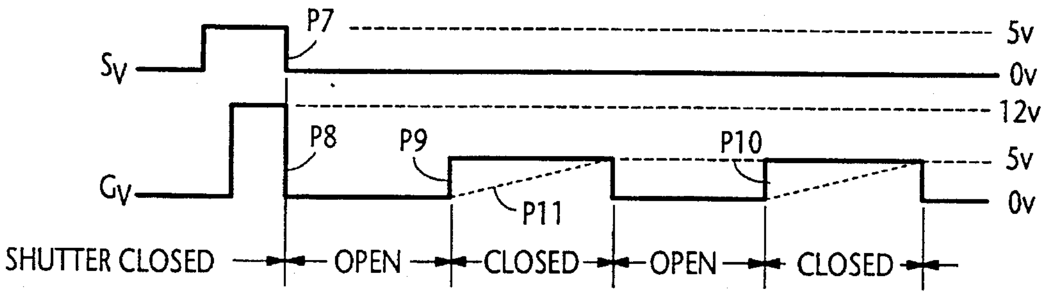
FIG. 4B is a time sequence of modified drive pulses.

As illustrated in FIG. 4B, the microshutter of FIG. 1 is operated initially in response to pulses P7 and P8 in the same manner as in FIG. 4A. With the shutter being latched in the rightside position, a pulse P9 of typically 5 volts is reapplied to the gate electrode 21. The reapplication of pulse P9 causes the electrons entrapped in the shutter to move to the floating gate 14. This results in a reduction in the electrostatic repulsion between shutter 23 and portion 25. The shutter 23 is thus returned to the shutter closing position by the spring force of arms 24 and remains in this position as long as the pulse P9 is applied. The termination of pulse P9 causes the electrons in the floating gate 14 to spread out into the shutter again and electrostatic repulsion occurs again between shutter 23 and projecting portion 25, thus moving the shutter 23 to the shutter opening position. Thereafter, the electrostatic shutter is repeatedly closed and open by application of a pulse P10. Therefore, once the electrons are entrapped in the shutter mechanism, the shutter operation is controlled exclusively by application of a pulse on the gate electrode 21.

According to an interesting feature of this embodiment, the shutter closing position can be varied as desired by controlling the voltage of the pulse P9 In the range between zero and 5 volts. If a ramp voltage as indicated by dotted lines P11 is used as a shutter closing pulse, the shutter opening will be gradually reduced.

Figure 5:
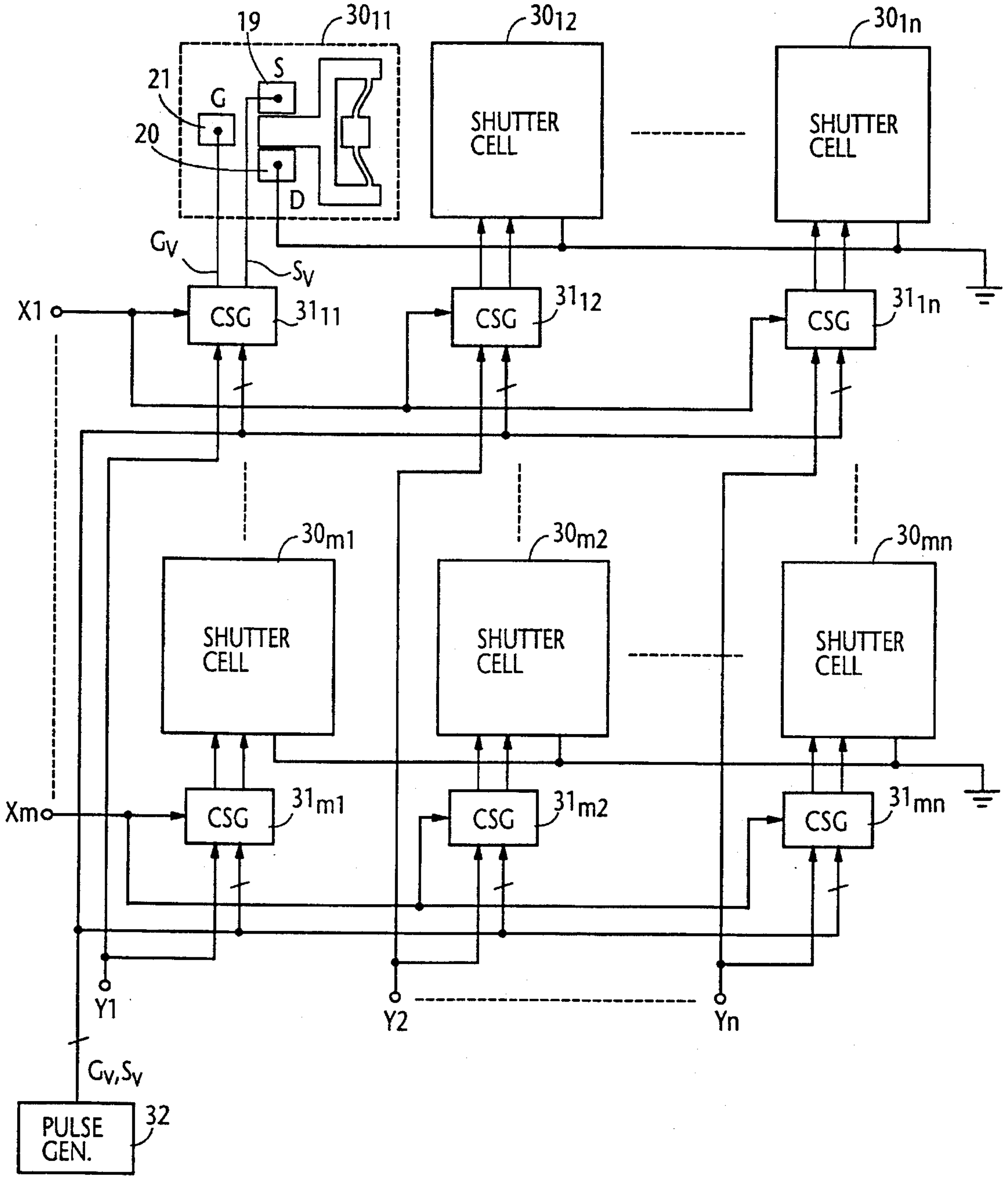
FIG. 5 is a block diagram of a matrix array of the microshutter cells of the first embodiment.

An array of microshutter cells is fabricated using the first embodiment of the present invention as shown in FIG. 5. The cell array comprises an (m×n) matrix array of cells $30_{ij}$ (where i=1, 2, . . . , m, and j=1, 2. . . , n). The drain electrodes 20 of all microshutter cells are connected to ground. A plurality of cell selecting gates $31_{ij}$ are associated respectively with microshutter cells $30_{ij}$. Each of the cell selecting gates $31_{ij}$ is responsive to a row select signal Xi and a column select signal Yj for coupling the shutter control voltages $S_v$ and $G_v$ of FIG. 4A or 4B supplied from a pulse generator 32 to the source and gate electrodes 19 and 21, respectively, of the associated microshutter cell if a coincidence occurs between the row and column select signals applied to the cell.

Figure 6:
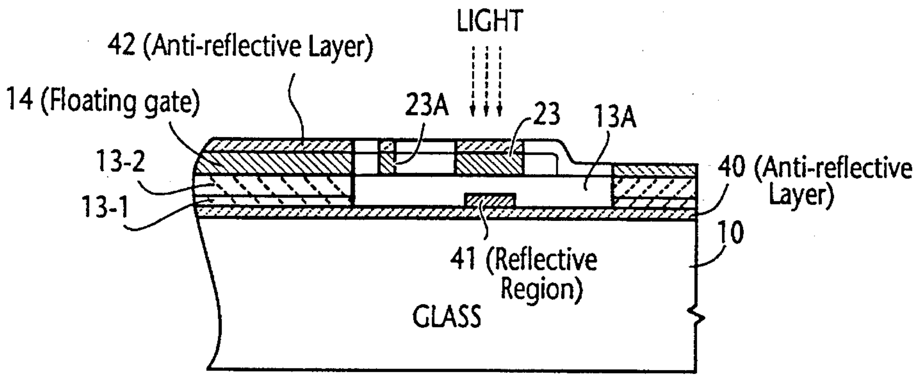
FIG. 6 is a cross-sectional view of the microshutter cell according to a further modification of the present invention.

FIG. 6 is a modification of the present invention in which incident light is reflected when the shutter is open. An anti-reflective layer 40 is deposited on the glass substrate 10 for absorbing light incident thereon. A light reflective region 41 of non-corrosive material is formed on the antireflective reflective layer 40. In the same manner as described, insulative layer 13-1, floating gate 14 and insulative layer 13-2 are successively deposited and part of the insulative layers 13-1 and 13-2 is etched to form the well 13A. With this etching process, the reflective region 41 is revealed in a position below the shutter 23 and offset from the window 23A. The upper surface of the microshutter is then coated with an anti-reflective layer 42. When the shutter is closed, light incident from above is prevented by shutter 23 from reaching the reflective region 41. When the shutter 23 is moved to the right by electrostatic repulsion, the window 23A is moved to a position above the reflective region 41, allowing incident light to reflect off the region 41. Since light is directly incident on the device, rather than through the substrate as in the case of FIG. 1, the usable light has a higher intensity, or signal to noise ratio in comparison with the non-reflective type of FIG. 1. For a given signal to noise ratio, the intensity of incident light can be decreased to advantage. A further advantage of the reflective type shutter is that it allows any material to be used for the substrate.

Figure 7:
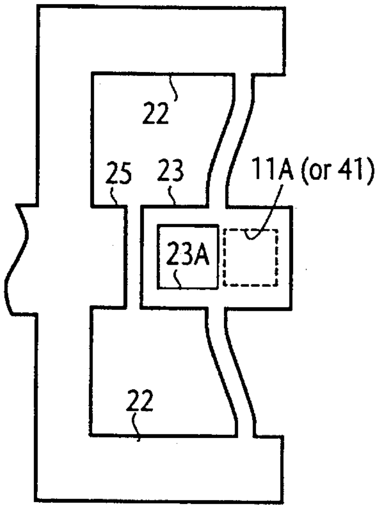
FIGS. 7 to 9 are plan views of shutter mechanisms according to modifications of the embodiments of FIGS. 1 and 6.
Figure 8:
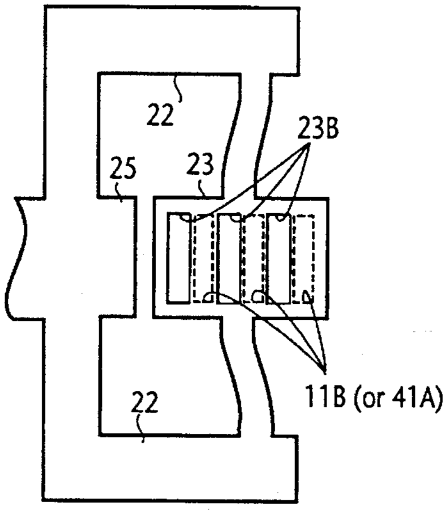
Figure 9:
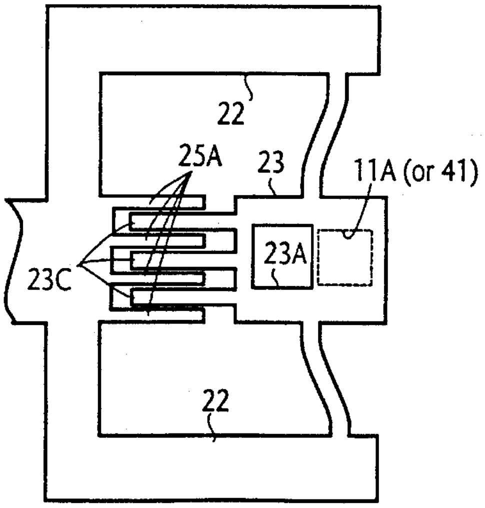

The electrostatic shutter of this invention is further modified in a number of ways as shown in FIGS. 7, 8 and 9. In FIG. 7, the shutter 23 is formed with a square-shaped window 23A on the left half of its area and the right half of its area is positioned over the window 11A or light reflective region 41 when the shutter is closed. When the shutter 23 is moved to the region 41) below to allow light to pass through. The effect of this right, the window 23A is aligned with the window 11A (or light reflective arrangement is to allow dimensioning of the space between the opposed edges of shutter 23 and projecting portion 25 and allow positioning of the window 23A relative to window 11A to be made independently of each other. Namely, the timing at which the window 23A begins to align with the window 11A (or light reflective region 41) can be determined precisely regardless of the electrostatic repulsion of the shutter. Additionally, the shape of the window 23A can be determined as desired regardless of the repulsive force. For example, the amount of admitted light can be varied stepwisely by use of a shutter of stepped shape.

The stroke of the shutter 23 can be advantageously decreased by an arrangement shown in FIG. 8. According to this modification, the shutter 23 is formed with a set of parallel slits 23B of equal width, and the window 11A is in the form of parallel slits 11B (or the reflective region 41 is in the form of stripes 41A of equal width) with the slits 23B and 11B (or stripes 41A) extending in a direction normal to the direction of movement of the shutter 23. When the shutter is closed, light is obstructed by the shutter 23. When opening the shutter, it is only necessary that shutter 23 be moved as small as the width of each slit 23B to the right to align all slits 23B respectively with slits 11B (or stripes 41A). For a given amount of light, the voltage used to inject electrons to the electrostatic shutter can be decreased and the speed of shutter operation can be increased.

The microshutter is further modified to effectively increase electrostatic repulsion as shown in FIG. 9. In this modification, the projecting portion 25 is serrated to form a plurality of teeth 25A extending in the direction of movement of shutter 23. The shutter 23 is likewise formed with teeth 23B which are arranged to electrostatically movably interlock with the teeth 25A. Since the opposed surfaces of the interlocking teeth 23A and 25A are increased, the electrostatic repulsion of the shutter is much greater than that available with the previous embodiments. For a given stroke, the amount of electrons to be entrapped in the shutter mechanism can be decreased to advantage.

A microshutter according to a second embodiment of the present invention is shown in FIGS. 10, 11, 12 and 13, in which silicon is used as a substrate 50. A widow passageway 50A is provided in the substrate 50 to admit incident light from below. By using diffusion technique, diffused drain and source regions 51 and 52 of a first transistor and drain and source regions 53 and 54 of a second transistor are formed on the silicon substrate 50. On the substrate 50 is deposited an silicon-dioxide layer 55 on which is formed a layer of polysilicon. As in the first embodiment, the polysilicon is etched using a photo-mask to form the floating gate 14 above the source region 52 and the electrostatic shutter including the conductive regions 22, shutter 23 and supporting arms 24. The etching process is continued to form an etched well 55A in the insulative layer 55 below the shutter 23 and arms 24. The shutter 23 produced in this way is located above the widow passageway 50A. The silicon dioxide layer 55 is etched in positions over the drain region 53 of the second transistor and over the drain and source regions 51 and 52 of the first transistor as well as over the source region 54 of the second transistor. A metallized contact 56 is provided for contacting the floating gate 14 with the drain region 53 of the second transistor. Simultaneously, metallized contacts are formed on the drain and source regions 51 and 52 of the first transistor, respectively, to serve the drain electrode 57 and source electrode 58 of the first transistor. A metallized contact 60 is formed on the source region 54 to serve as the source electrode 60 of the second transistor. On the silicon dioxide layer 55 are further provided a metallized contact 59 over the source-drain channel of the first transistor to serve as the gate of this transistor and a metallized contact 61 over the source-drain channel of the second transistor to serve as the gate of the second transistor.

The operation of the second embodiment is as follows. The source electrodes 57 and 58 of both transistors are connected to ground and the drain electrode 56 of the first transistor is connected to a voltage source. Gate voltage pulses G1 and G2 are applied to gate electrodes 59 and 61, respectively, for operating the microshutter of FIG. 10.

Figure 14A:
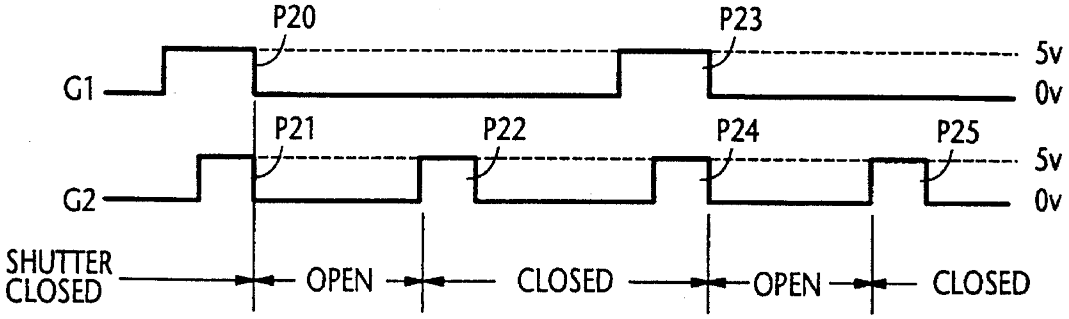
FIG. 14A is a time sequence of pulses used to drive the microshutter cells of FIG. 10.

As shown in FIG. 14A, when a 5-volt pulse P20 is applied to the gate electrode 59 of the first transistor, a current flows through the channel of the first transistor from the drain region 51 to the source region 52, The source region 52 is driven to a high voltage and because of electrostatic induction electrons are attracted to the lower surface of the floating gate 14 that is immediately above the source region 52 and the opposite surface of the floating gate is positively charged. To the gate electrode 61 of the second transistor is applied a 5-volt pulse P21 whose leading edge is delayed with respect to the leading edge of pulse P20 and whose trailing edge is time coincident with the trailing edge of pulse P20. As a result, electrons are injected into the floating gate 14, neutralizing the positive charge. The second transistor thus operates as a current switch. The current switch is then turned off by terminating the pulse P21 at the gate 61. The turn-off of the current switch causes the injected electrons to be entrapped in the floating gate 14. The pulse P20 at the gate 59 is terminated simultaneously with the turn-off of the current switch, the electrons entrappeal in the floating gate 14 spread out into the electrostatic shutter comprising the elements 22 to 25. Electrostatic repulsion thus occurs between the shutter 23 and projecting portion 25 of the shutter, causing shutter 23 to move to the right, admitting light incident from passageway 50A to pass upwards.

Figure 14B:
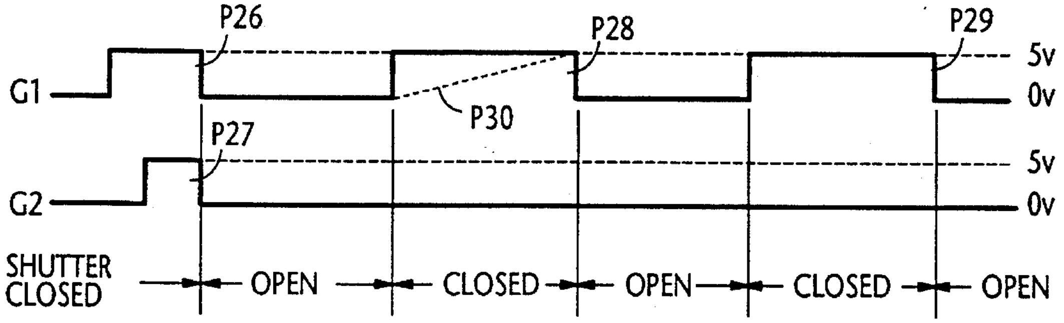
FIG. 14B is a time sequence of modified drive pulses.

The shutter 23 is thus latched in position until the entrapped electrons are discharged from the floating gate 14. This is simply achieved by applying a pulse P22 to the gate 61 of the second transistor. The microshutter is subsequently opened by reapplying pulses P23 and P24 having the same patterns as pulses P20 and P21 to the gates 59 and 61, respectively, and then closed by reapplying a pulse P25 to the gate As illustrated in FIG. 14B, the microshutter of FIG. 10 is operated initially in response to pulses P26 and P27 in the same manner as in FIG. 14A. With the shutter being latched in the shutter opening position, a 5-volt pulse P28 is reapplied to the gate 59 of the first transistor. The reapplication of pulse P28 causes the electrons entrappeal in the shutter to move to the floating gate 14, resulting in a reduction in the electrostatic repulsion between shutter 23 and portion 25 in a manner similar to the first embodiment. The shutter 23 is thus returned to the shutter closing position by the spring force of arms 24 and remains in this position as long as the pulse P28 is applied. The termination of pulse P28 causes the electrons in the floating gate 14 to spread out into the shutter again and electrostatic repulsion occurs again between shutter 23 and portion 25, thus moving the shutter 23 to the shutter opening position. Thereafter, the microshutter is repeatedly closed and open by application of a pulse P29. In a manner similar to that shown in FIG. 4B, the shutter closing position can be varied as desired by controlling the gate voltage G1 in the range between zero and 5 volts, Thus, the use of a ramp voltage as indicated by dotted lines P30 as a shutter closing pulse enables the shutter opening to be be gradually reduced.

Figure 15:
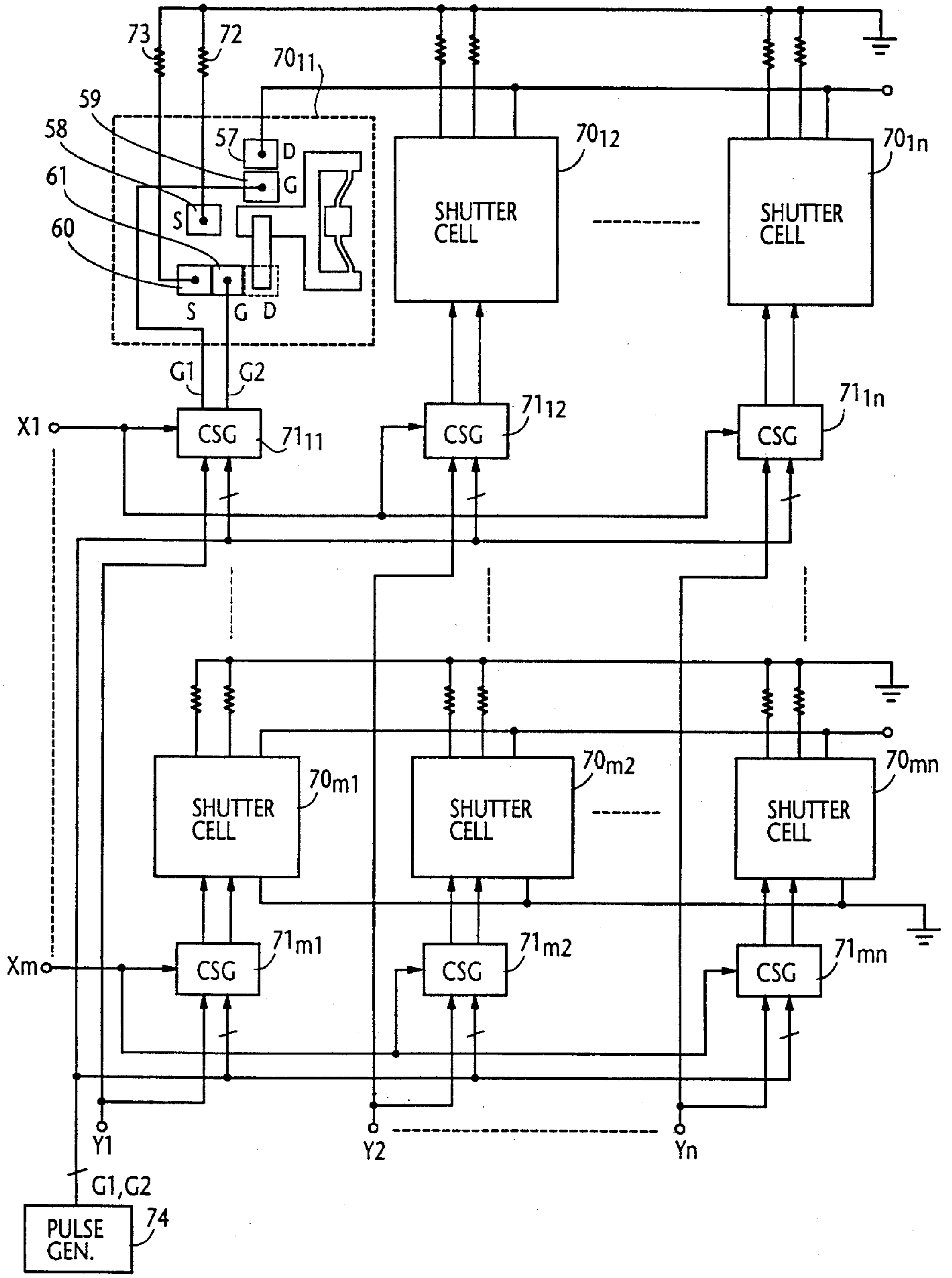
FIG. 15 is a block diagram of a matrix array of the microshutter cells of the second embodiment.

An (m×n) matrix array of microshutter cells $70_{ij}$ is fabricated using the embodiment of FIG. 10 as illustrated in FIG. 15 in which cell selecting gates $71_{ij}$ are associated respectively with microshutter cells $70_{ij}$. The drain electrode 57 of each microshutter cell is connected to a suitable DC voltage source, not shown, and the source electrodes 58 and 60 are connected to ground via resistors 72 and 73, respectively. Each of the cell selecting gates $71_{ij}$ is responsive to a row select signal Xi and a column select signal Yj for coupling the gate control voltages G1 and G2 of FIG. 14A or 14B supplied from a pulse generator 74 to the gate electorodes 59 and 61, respectively, of the associated microshutter cell if a coincidence occurs between the row and column select signals applied to the cell.

What is claimed is:

1. An electrostatically driven microshutter comprising:

a substrate having a principal surface;

a floating gate on said principal surface of the substrate;

a shutter mechanism formed of conductive material and electrically connected to said floating gate, said shutter mechanism comprising a shutter and resilient support means for supporting the shutter from said principal surface so that the shutter is movable in a direction parallel to said principal surface by electrostatic repulsion between said shutter and said floating gate; and control means for injecting electrons into said floating gate in response to a first voltage signal and decreasing the electrons injected in said shutter mechanism in response to a second voltage signal.

2. An electrostatically driven microshutter as claimed in claim 1, wherein said control means comprises a transistor having source and drain regions for establishing a conduction channel therebetween, and a gate region for controlling a current through said conduction channel in response to said first voltage signal, wherein said floating gate is located between said conduction channel and said gate region so that said electrons are injected from said conduction channel into the floating gate in response to said first voltage signal.

3. An electrostatically driven microshutter as claimed in claim 2, wherein said first voltage signal comprises low voltage pulses and subsequent high voltage pulses, and said second voltage signal comprises high voltage pulses, each of the low voltage pulses of the first voltage signal being time coincident with each of the high voltage pulses of the second voltage signal for Injecting electrons into said floating gate, and each of the subsequent high voltage pulse of the first voltage signal being generated exclusively for discharging said electrons.

4. An electrostatically driven microshutter as claimed in claim 2, wherein said first voltage signal comprises a low voltage pulse and said second voltage signal comprises a high voltage pulse and a subsequent low voltage pulse, the low voltage pulse of the first voltage signal being time coincident with the high voltage pulse of the second voltage signal for injecting said electrons Into said floating gate, and said subsequent low voltage pulse of the second voltage signal being generated for attracting the electrons in said shutter mechanism to said floating gate.

5. An electrostatically driven microshutter as claimed in claim 4, wherein the subsequent low voltage pulse of said second voltage signal has a time-varying amplitude.

6. An electrostatically driven microshutter as claimed in claim 1, wherein said control means comprises:

a first transistor having source and drain for establishing a conduction channel therebetween, and a gate for controlling a current in said conduction channel, said source region being located in proximity to said floating gate, the gate of the first transistor being responsive to said first voltage signal for attracting electrons from said floating gate to the source of the first transistor so that said floating gate acquires a negative charge on a first surface thereof proximal to said source region and acquires a positive charge on a second surface thereof distal to said source region; and a second transistor connected to said floating gate for neutralizing said positive charge, so that the attracted electrons are trapped in said floating gate and said shutter mechanism.

7. An electrostatically driven microshutter as claimed in claim 6, further comprising means for applying said second voltage signal to said second transistor for discharging the electrons trapped in said shutter mechanism.

8. An electrostatically driven microshutter as claimed in claim 6, further comprising means for repeatedly applying said first voltage signal to the gate region of the first transistor for attracting the electrons in said shutter mechanism to said floating gate.

9. A microshutter array as claimed in claim 8, wherein the repeatedly applied first voltage signal has a time-varying amplitude.

10. An electrostatically driven microshutter as claimed in claim 1, wherein said substrate is formed of light transmissive material, further comprising an opaque layer on said principal surface of the substrate, said opaque layer having a window for admitting light incident on said light transmissive substrate, said window being positioned with respect to said shutter so that said admitted light is obstructed or unobstructed by said shutter depending on the position of the shutter with respect to said window.

11. An electrostatically driven microshutter as claimed in claim 10, wherein said shutter is formed with a window for allowing light to pass therethrough when the window of the shutter is aligned with the window of said opaque layer.

12. An electrostatically driven microshutter as claimed in claim 10, wherein said window of the opaque layer is a plurality of parallel slits elongated in a direction normal to the direction of movement of said shutter, and wherein said shutter is formed with a plurality of slits for allowing light to pass therethrough when the slits of the shutter are respectively aligned with the slits of said opaque layer.

13. An electrostatically driven microshutter as claimed in claim 1, wherein said floating gate has a plurality of teeth extending in a direction parallel to the direction of movement of the shutter, and wherein said shutter has a plurality of teeth electrostatically movably interlocked with the teeth of said floating gate.

14. An electrostatically driven microshutter as claimed in claim 1, wherein said substrate is formed of semiconductor material, said substrate having a window passageway for admitting light incident on said substrate, said window passageway being positioned with respect to said shutter so that said admitted light is obstructed or unobstructed by said shutter depending on the position of the shutter with respect to said window passageway.

15. An electrostatically driven microshutter as claimed in claim 14, wherein said shutter is formed with a window passageway for allowing light to pass therethrough when the window of the shutter is aligned with the window passageway.

16. An electrostatically driven microshutter as claimed in claim 1, further comprising a first anti-reflective layer on said principal surface of said substrate, a second anti-reflective layer on said shutter and a reflective region on said first anti-reflective layer, said reflective region being located in such a position that light is reflected off the reflective region when said shutter is not in the path of said light to said reflective region.

17. An electrostatically driven microshutter as claimed in claim 16, wherein said shutter is formed with a window for allowing light to pass therethrough when the window of the shutter is aligned with said reflective region.

18. An electrostatically driven microshutter as claimed in claim 16, wherein said reflective region is in the form of a plurality of parallel stripes elongated in a direction normal to the direction of movement of said shutter, and wherein said shutter is formed with a plurality of slits for allowing light to pass therethrough when the slits of the shutter are respectively aligned with said stripes.

19. A microshutter array comprising:

a plurality of microshutter cells arranged in a matrix of rows and columns, each of said microshutter cells comprising:

a substrate having a principal surface;

a transistor having source and drain regions for establishing a conduction channel therebetween, and a gate region for controlling a current through said conduction channel;

a floating gate between said conduction channel and said gate region for receiving electrons from said conduction channel; and a shutter mechanism formed of conductive material and electrically connected to said floating gate, said mechanism comprising a shutter and resilient support means for supporting the shutter from said principal surface so that the shutter is movable in a direction parallel to said principal surface by electrostatic repulsion between said shutter and said floating gate;

means for generating first and second voltage signals; and a plurality of cell selecting circuits associated respectively with said microshutter cells, each of the cell selecting circuits being response to a set of row and column signals for coupling said first and second voltage signals to the source and gate regions of the associated microshutter cell, respectively.

20. A microshutter array as claimed in claim 19, wherein said first voltage signal comprises low voltage pulses and subsequent high voltage pulses, and said second voltage signal comprises high voltage pulses, each of the low voltage pulses of the first voltage signal being time coincident with each of the high voltage pulses of the second voltage signal for injecting electrons into said floating gate, and each of the subsequent high voltage pulse of the first voltage signal being generated exclusively for discharging said electrons.

21. A microshutter array as claimed in claim 19, wherein said first voltage signal comprises a low voltage pulse and said second voltage signal comprises a high voltage pulse and a subsequent low voltage pulse, the low voltage pulse of the first voltage signal being time coincident with the high voltage pulse of the second voltage signal for injecting said electrons into said floating gate, and said subsequent low voltage pulse of the second voltage signal being generated exclusively for attracting the electrons in said shutter mechanism to said floating gate.

22. A microshutter array as claimed in claim 21, wherein the subsequent low voltage pulse of said second voltage signal has a time-varying amplitude.

23. A microshutter array comprising:

a plurality of microshutter cells arranged in a matrix of rows and columns, each of said microshutter cells comprising;

a substrate having a principal surface;

a first transistor having source and drain regions for establishing a conduction channel therebetween, and a gate region for controlling a current through said conduction channel;

a floating gate located in proximity to the source region of said transistor for receiving electrons from said source region;

a shutter mechanism formed of conductive material and electrically connected to said floating gate, said mechanism comprising a shutter and resilient support means for supporting the shutter from said principal surface so that the shutter is movable in a direction parallel to said principal surface by electrostatic repulsion between said shutter and said floating gate; and a second transistor having source and drain regions for establishing a conduction channel therebetween, and a gate region for controlling a current in said conduction channel, the drain and source regions of the second transistor being connected between said floating gate and ground;

means for generating first and second voltage signals; and a plurality of cell selecting circuits associated respectively with said microshutter cells, each of the cell selecting circuits being responsive to a set of row and column signals for coupling said first and second voltage signals respectively to said gate regions of the first and second transistors of the associated microshutter cell.

24. A microshutter array as claimed in claim 23, wherein said first voltage signal comprises a first pulse, and said second voltage signal comprises second and third pulses, said first pulse and said second pulse being time coincident with each other and applied respectively to the gate regions of said first and second transistors for injecting said electrons into said floating gate, said third pulse being applied to said gate region of the second transistor for discharging the injected electrons.

25. A microshutter array as claimed in claim 23, wherein said first voltage signal comprises first and second pulses, and said second voltage signal comprises a third pulse, said first pule and said third pulse being time coincident with each other and applied respectively to the gate regions of said first and second transistors for injecting said electrons into said floating gate, and said second pulse being applied to the gate region of the first transistor for attracting the electrons in said shutter mechanism to said floating gate.

26. A microshutter array as claimed in claim 25, wherein said second pulse has a time-varying amplitude.

* * * * *